United States Patent
Takahashi

(10) Patent No.: US 7,938,577 B2
(45) Date of Patent: May 10, 2011

(54) FLUID TEMPERATURE CONTROL DEVICE

(75) Inventor: Norio Takahashi, Kanagawa (JP)

(73) Assignee: Kelk Ltd., Kanagawa (JP)

( * ) Notice: Subject to any disclaimer, the term of this patent is extended or adjusted under 35 U.S.C. 154(b) by 505 days.

(21) Appl. No.: 12/011,296

(22) Filed: Jan. 25, 2008

(65) Prior Publication Data

US 2008/0212642 A1    Sep. 4, 2008

(30) Foreign Application Priority Data

Jan. 29, 2007   (JP) ................................. 2007-017815

(51) Int. Cl.
*G01K 17/00* (2006.01)
*G01F 1/00* (2006.01)

(52) U.S. Cl. ............. 374/147; 374/39; 374/29; 73/861; 73/202.5; 73/202.11

(58) Field of Classification Search ............. 374/10–12, 374/29–39, 43–45, 100, 109–115, 141, 147, 374/148, 165, 166, 208, 137, 4, 7; 73/861, 73/202.5, 204.11, 204.18, 204.19, 204.22

See application file for complete search history.

(56) References Cited

U.S. PATENT DOCUMENTS

| | | | | |
|---|---|---|---|---|
| 2,800,793 A | * | 7/1957 | Oliver | 374/33 |
| 4,504,156 A | * | 3/1985 | Currie et al. | 374/45 |
| 4,522,511 A | * | 6/1985 | Zimmerer | 374/32 |
| 4,595,824 A | * | 6/1986 | Harvey et al. | 392/484 |
| 4,906,105 A | * | 3/1990 | Geake | 374/30 |
| 5,482,372 A | * | 1/1996 | Bataillard et al. | 374/31 |
| 5,779,363 A | * | 7/1998 | Freire et al. | 374/33 |
| 5,915,838 A | * | 6/1999 | Stals et al. | 374/45 |
| 5,940,987 A | * | 8/1999 | Stummer | 34/576 |
| 5,943,991 A | * | 8/1999 | Moroi et al. | 123/142.5 R |
| 6,938,688 B2 | * | 9/2005 | Lengauer et al. | 165/170 |
| 7,332,139 B2 | * | 2/2008 | Schutte et al. | 422/198 |
| 7,445,385 B2 | * | 11/2008 | Lin | 374/147 |
| 7,674,037 B2 | * | 3/2010 | Liu et al. | 374/44 |

FOREIGN PATENT DOCUMENTS

| | | | |
|---|---|---|---|
| CN | 2926973 Y | * | 7/2007 |
| JP | 55146311 A | * | 11/1980 |
| JP | 2003-338489 | | 11/2003 |

* cited by examiner

*Primary Examiner* — Gail Verbitsky
(74) *Attorney, Agent, or Firm* — Husch Blackwell LLP

(57) ABSTRACT

A fluid temperature control device, which includes: a main body block having a passage channel formed in a surface thereof; a thermal conducting plate that is provided on the surface of the main body block, and covers the passage channel to form a passage for passing a fluid to be temperature controlled; and temperature control means that carries out heat exchanging (heating/cooling), by way of the thermal conducting plate, with the fluid passing through the passage, in which the passage abutting on the thermal conducting plate connects a fluid inlet and a fluid outlet formed in the main body block, and is a single passage having an approximately constant passage cross-sectional area over its entire length.

2 Claims, 13 Drawing Sheets

FLUID TEMPERATURE CONTROL DEVICE

This application claims priority of Japanese Patent Application No. 2007-017815 filed on Jan. 29, 2007.

BACKGROUND OF THE INVENTION

1. Field of the Invention

The present invention relates to a fluid temperature control device, more particularly relates to a configuration of a fluid temperature control device suitable for application in controlling the temperature of a treatment solution in a semiconductor manufacturing process.

2. Description of the Related Art

For example, in the semiconductor manufacturing field, to control the temperature of chemical solutions in various manufacturing processes, a fluid temperature control device that heats/cools a treatment solution using, for example, a thermoelectric module, or a fluid temperature control device that heats the treatment solution using a heater is employed.

Additionally, as one example of the fluid temperature control device described above, there has been provided a configuration which includes a main body block in which a passage is formed, a thermal conducting plate provided to the main body block and abutting on the passage, temperature control means that heats/cools the thermal conducting plate, wherein heat exchange between the temperature control means and the treatment solution passing through the passage is carried out by way of the thermal conducting plate (see, for example, Japanese Patent Application Laid-open No. 2003-338489).

A fluid temperature control device A' shown in FIG. 11 is one example of the configuration above. A passage P (FIGS. 12 and 13), which will be described later, is formed in a main body block B that is made of resin, and metal thermal conducting plates E, E are attached to a right and a left surfaces Ba, Ba of the main body block B in a manner that each of the plates abuts on the passage P.

Additionally, a Peltier module (thermoelectric module) M as the temperature control means is attached to an outer surface of each of the thermal conducting plates E. To the outer surface of the Peltier module M described above, a water jacket C that radiates/absorbs heat of the Peltier module M is attached.

FIG. 12 shows one example of the passage P in the main body block B. In a manner that plural walls Bb, Bb, Bb are fixedly set in a staggered formation, the passage P is provided in an opening Bo that is penetratingly formed in the main body block B.

In the configuration above, the treatment solution is entered into an inlet pipe I as shown by an arrow i and then flows into the passage P through an inlet passage Ip. By repeating reversing turns and passing through the passage P while contacting to a thermal conducting plate E, the treatment solution is heated/cooled by the thermal conduction with the thermal conducting plate E. Then, after passing through the passage P, the treatment solution is discharged from an outlet pipe O through an outlet passage Op as shown by an arrow o.

FIG. 13 shows another example of the passage P in the main body block B. The passage P is formed by a concave portion Br that is depressedly formed in a substantially entire area of a surface Ba of the main body block B.

In the configuration above, the treatment solution is entered into an inlet pipe I as shown by an arrow i and flows into the passage P through inlet openings Io, Io, Io of an inlet passage Ip. By passing through and crossing the passage P in a vertical direction as shown by arrows a, a, a while contacting to a thermal conducting plate E, the treatment solution is heated/cooled by the thermal conduction with the thermal conducting plate E. Then, as shown by arrows b, b, b, the treatment solution flows out from the passage P into discharge openings Oo, Oo, Oo, and is discharged from an outlet pipe O through an outlet passage Op as shown by an arrow o.

Incidentally, in the conventional fluid temperature control device B described above, in a case when the passage P in the configuration in FIG. 12 is employed, the treatment solution turns in 180° after hitting inner surfaces of the opening Bo, and passes between the opening Bo and the walls Bb. Thus, the flow velocity is decreased due to the large pressure loss, and the thermal resistance becomes large because of drop in the heat transfer coefficient, resulting in deteriorating in the heating/cooling capability.

Additionally, in the passage P in the configuration shown in FIG. 12, due to the fact that a cross-sectional area varies along its entire length, the flow velocity difference in the treatment solution between a fast flow portion and a slow flow portion becomes significant, and there occur variations in the thermal conduction between the solution and the thermal conducting plate E (FIG. 11). Thus, in a case where the Peltier module is employed as the temperature control means, the junction temperature partly rises, which causes a problem of reduction in the life time of the Peltier module.

On the other hand, in a case when the passage P as shown in FIG. 13 is employed, the flow velocity of the treatment solution is extremely slow because the passage P is formed in a wide area in a surface Ba of the main body block B. Thus, the thermal resistance becomes large because of drop in the heat transfer coefficient, resulting in deteriorating in the heating/cooling capability.

Additionally, in the passage P as shown in FIG. 13, the flow velocity of the treatment solution is not uniform over the entire area of the passage P having a wide area, and there occur variations in the thermal conduction between the solution and the thermal conducting plate E (FIG. 11). Thus, in a case where the Peltier module is employed as the temperature control means, the junction temperature partly rises, which causes a problem of reduction in the life time of the Peltier module.

In view of the circumstance stated above, the object of the present invention is to provide a fluid temperature control device that can improve the temperature control capacity (capacity of heating/cooling) of the fluid to be temperature controlled, and suppress the reduction in the mechanical life caused by variation in temperature.

SUMMARY OF THE INVENTION

To achieve the object stated above, a first aspect of the present invention provides a fluid temperature control device, which includes a main body block having a passage channel formed in a surface thereof; a thermal conducting plate that is provided on the surface of the main body block, and covers the passage channel to form a passage for passing a fluid to be temperature controlled; and temperature control means that carries out heat exchanging, by way of the thermal conducting plate, with the fluid passing through the passage, wherein the passage abutting on the thermal conducting plate connects a fluid inlet and a fluid outlet formed in the main body block, and is a single passage having an approximately constant passage cross-sectional area over its entire length.

With the fluid temperature control device of the first aspect of the present invention, the passage abutting onto the thermal conducting plate is formed in a single passage that connects the fluid inlet and the fluid outlet, which are formed in the main body block, and the cross-sectional area of the passage is approximately constant over its entire length. Thus, the flow velocity of the fluid to be temperature controlled is uniform over the entire area of the passage, whereby the partial variations in the thermal conduction between the fluid and the thermal conducting plate can be prevented from occurring.

Accordingly, since there is no nonuniformity in the temperature in the thermal conducting plate, the junction temperature can be prevented from partially rising even in a case when the Peltier module is employed as the temperature control means. Therefore, the mechanical life of Peltier module above or other components can be prevented from inadvertently decreasing.

Additionally, a second aspect of the present invention provides the fluid temperature control device according to the first aspect of the present invention, in which the passage has a spiral shape.

With the fluid temperature control device of the second aspect of the present invention, the passage has a spiral shape that winds in one direction while the cross-sectional area of the passage is approximately constant over its entire length. This brings high fluid velocity and less pressure loss of the fluid to be temperature controlled and passing through the passage, whereby the thermal conduction between the thermal conducting plate and the fluid to be temperature controlled can be efficiently performed. Accordingly, the temperature controlling capacity (capacity of heating/cooling) of the fluid to be temperature controlled can be improved.

Additionally, a third aspect of the present invention provides the fluid temperature control device of the first aspect of the present invention, in which a drain passage that communicates adjacent passages is formed in a wall provided between the adjacent passage channels in the main body block.

With the fluid temperature control device of the third aspect of the present invention, the drain passage that communicates the adjacent passages is formed in the wall of the passage channel. Therefore, the fluid to be temperature controlled and that remains in the passage at the time when the device is stopped can be discharged to the outside of the device through the drain passage.

Additionally, a fourth aspect of the present invention provides the fluid temperature control device according to the second aspect of the present invention, in which a drain passage that communicates adjacent passages is formed in a wall provided between the adjacent passage channels in the main body block.

With the fluid temperature control device of the fourth aspect of the present invention, the drain passage that communicates the adjacent passages is formed in the wall of the passage channel. Therefore, the fluid to be temperature controlled and that remains in the passage at the time when the device is stopped can be discharged to the outside of the device through the drain passage.

DETAILED DESCRIPTION OF THE INVENTION

Hereinbelow, the present invention will be described in detail with reference to the drawings showing an exemplary embodiment.

Figure 1:
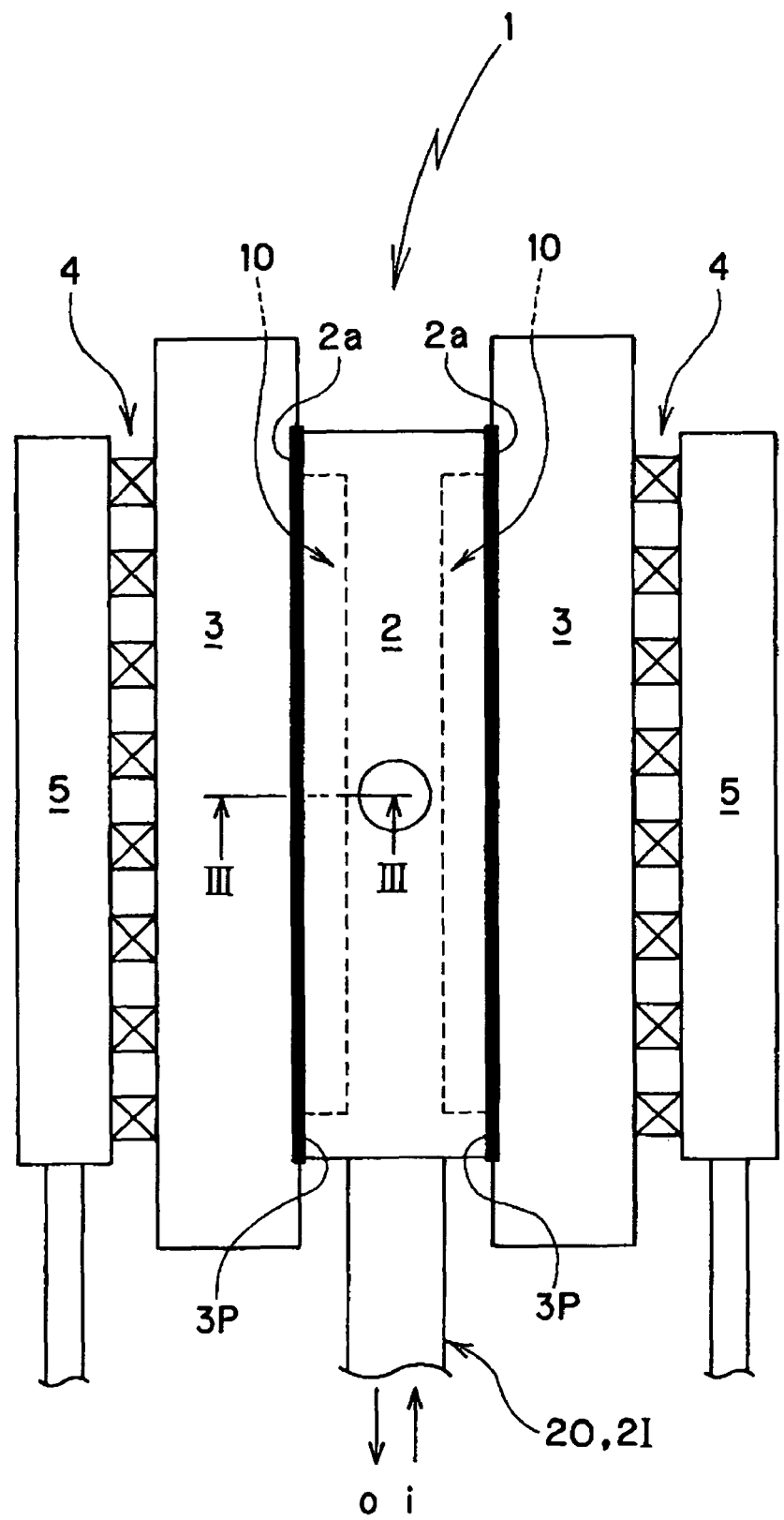
FIG. 1 is a conceptual overall plan view showing an example of a fluid temperature device according to the present invention.
Figures 2A, 2B:
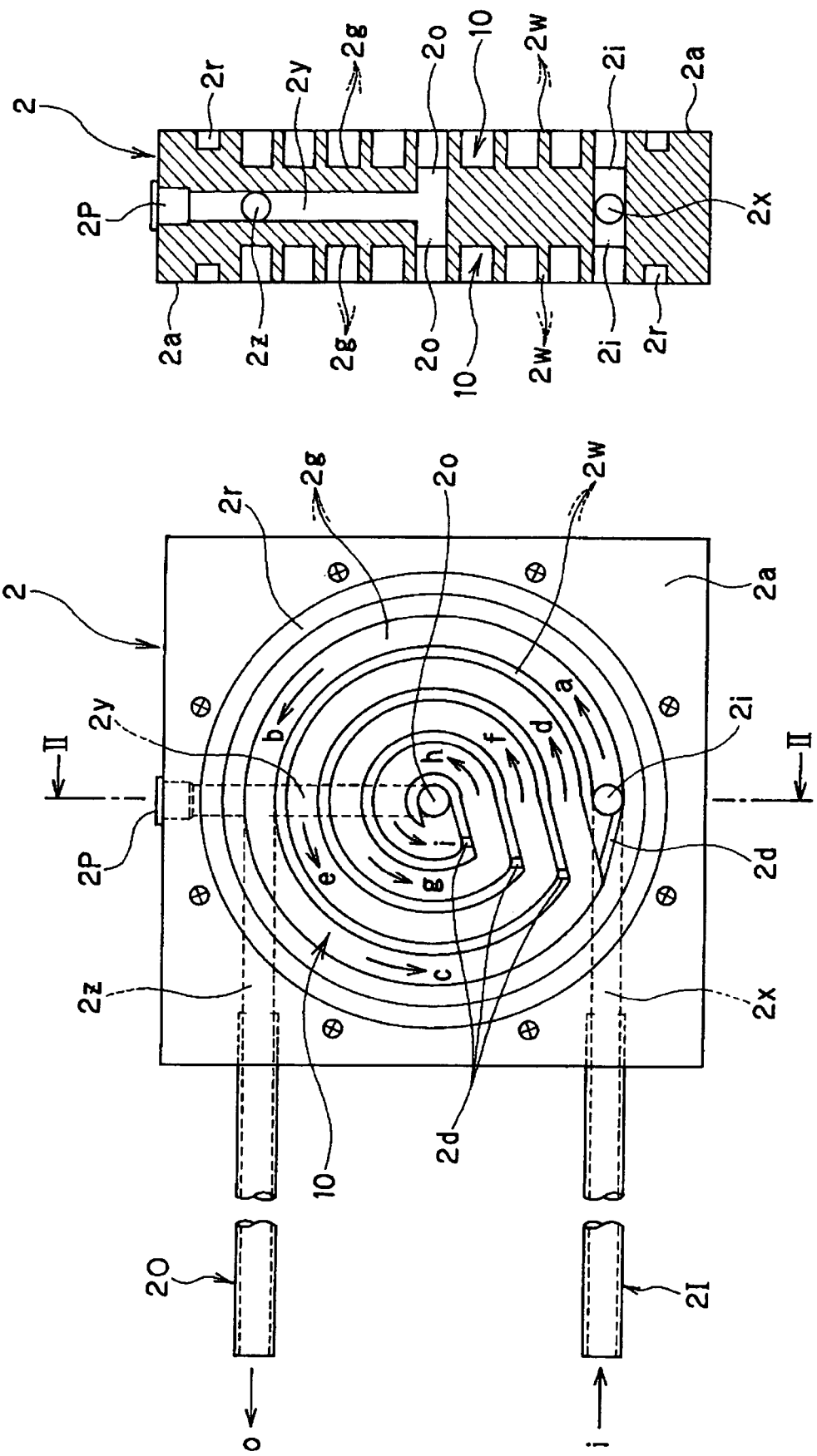
FIG. 2A is an overall side view of a main body block of the fluid temperature device shown in FIG. 1.
FIG. 2B is a sectional view taken from line II-II of FIG. 2A.
Figure 3:
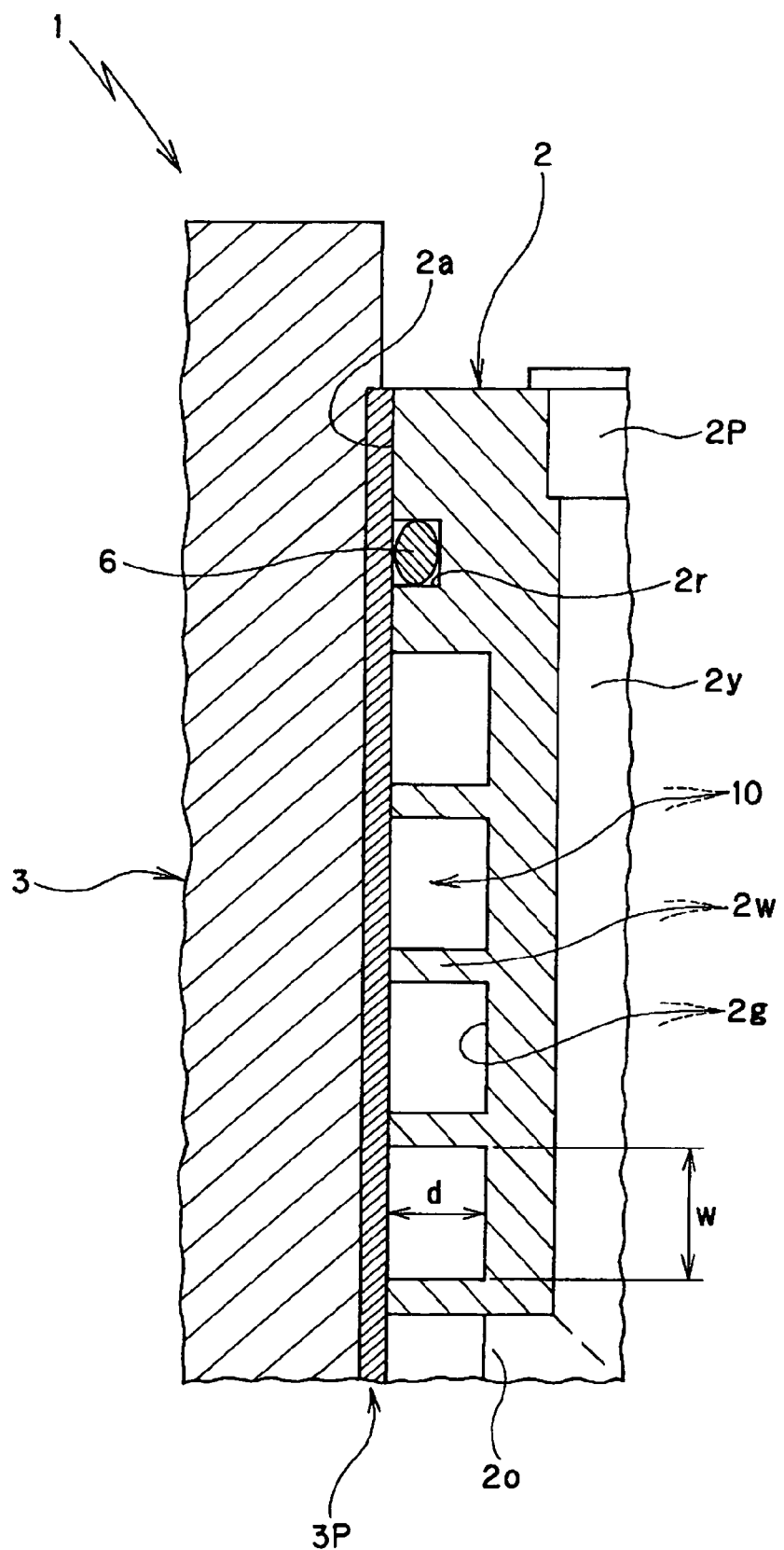
FIG. 3 is a sectional view taken from line III-III shown in FIG. 1 and illustrating the main portion of the fluid temperature control device shown in FIG. 1.

FIGS. 1 through 3 show an example in which the fluid temperature control device according to the present invention is applied to a fluid temperature control device for controlling temperature of chemical solutions (fluid to be temperature controlled) used for manufacturing process of semiconductors, specifically, acidic chemical solutions used for a wet process (RCA cleaning process), a wet etching or other process, such as ammonia peroxide mixture or hydrochloric acid peroxide mixture.

The fluid temperature control device 1 stated above comprises a main body block 2 which the chemical solution is entered into/discharged from, and a thermal conducting plate 3 that is provided to a surface 2a of the main body block 2. A Peltier module (thermoelectric module) 4 is attached, as temperature control means, to an outer surface of the thermal conducting plate 3. And, to an outer surface of the Peltier module 4, a water jacket 5 that radiates/absorbs heat of the Peltier module 4 is attached.

Additionally, a passage 10, which will be described later, is formed between the main body block 2 and the thermal conducting plate 3. Since the chemical solution passing through the passage 10 is contacted to the thermal conducting plate 3, heat exchanging is performed between the Peltier module 4 and the chemical solution by way of the thermal conducting plate 3, whereby the chemical solution is heated/cooled.

The main body block 2 described above is made of Teflon (registered trademark) or other resin materials that have a resistance to corrosion against chemical solutions. In the right and the left surfaces 2a, 2a of the main body block 2, passage channels 2g, 2g are formed in a form that will be described later.

To the main body block 2, an inlet pipe 2I and an outlet pipe 2O are attached. The inlet pipe 2I is connected through an inlet passage 2x formed in the main body block 2 to fluid inlets 2i, 2i that are opened respectively to the right and the left surfaces 2a, 2a in the main body block 2 described above. Additionally, the outlet pipe 2O described above is connected through the outlet passages 2y, 2z formed in the main body block 2 to the fluid outlets 2o, 2o that are opened respectively to the right and the left surfaces 2a, 2a in the main body block 2 described above.

The passage channel 2g formed in each of the surfaces 2a, 2a of the main body block 2 described above is a single channel that connects the fluid inlet 2i and the fluid outlet 2o. Within the range of circle, the passage channel 2g has a spiral shape that winds in a counter-clockwise direction from the fluid inlet 2i located on the side of outer periphery toward the fluid outlet 2o located on the side of center. The width w and the depth d of the passage channel 2g are formed so as to be approximately constant over its entire length of the passage channel 2g described above.

Additionally, since the passage channel 2g described above has the spiral shape, a drain passage 2d that is a notch communicating the adjacent passage channels 2g, 2g is provided in a wall 2w formed between the adjacent passage channels 2g, 2g. The drain passage 2d as shown in FIG. 2A is formed in all of the walls 2w, 2w, . . . located below the fluid outlet 2o.

Furthermore, to each of the surfaces 2a, 2a of the main body block 2 described above, a seal groove 2r formed in a circle and surrounding the passage 2g described above is formed, and an O ring is fitted into the seal groove 2r.

It should be note that an item 2P shown in FIGS. 2A and 2B is a plug fixedly provided to the main body block 2 for closing an opening of the end of the outlet passage 2y.

On the other hand, the thermal conducting plate 3 attached to each of the surfaces 2a, 2a of the main body block 2 described above is a flat-shaped block made of a material of high thermal conductivity such as aluminum. And, a disk-shaped anti-corrosion plate 3P is fixedly provided to a surface facing against the main body block 2.

Incidentally, the anti-corrosion plate 3P described above is formed of amorphous carbon having a resistance to corrosion against acidic chemical solutions and favorable thermal conductivity.

The thermal conducting plate 3 described above is attached to each of the right and the left surfaces 2a, 2a in the main body block 2. The pair of the thermal conducting plates 3, 3 is fixedly provided to a prescribed position of the main body block 2 by fastening each other using a bolt, a nut, a spring or other means, which are not shown, in a manner in which the main body block 2 is placed between the right and the left plates 3, 3.

As described above, by placing the thermal conducting plate 3 on the surface 2a of the main body block 2 and covering the passage channel 2g in the main body block 2 with the thermal conducting plate 3 (the anti-corrosion plate 3P), the passage 10 is formed between the main body block 2 and the thermal conducting plate 3.

It should be noted that the O ring 6 fitted into the seal groove 2r of the main body block 2 is pressed with the thermal conducting plate 3 (anti-corrosion plate 3P) in a state where the thermal conducting plate 3 is placed on the surface 2a of the main body block 2 as shown in FIG. 3, whereby the passage 10 above is sealed.

Here, because the width w and the depth d of the passage channel 2g in the main body block 2 is formed in a manner that is approximately constant over its entire length of the passage channel 2g as described above, the passage 10 formed between the main body block 2 and the thermal conducting plate 3 connects the fluid inlet 2i and the fluid outlet 2o in the main body block 2 while one single passage having the approximate constant passage cross-sectional area over its entire length is formed.

To the outer surface of the thermal conducting plate 3 describe above, the Peltier module 4 as the temperature control means is retained in a manner in which the Peltier module 4 is sandwiched by the water jacket 5. The Peltier module 4 is thermally connected to the thermal conducting plate 3 and the water jacket 5 by way of an insulating layer (not shown).

In the fluid temperature control device 1 having the configuration described above, the chemical solution is entered into the inlet pipe 2I as shown by the arrow i and flows from the fluid inlet 2i into the passage 10 by way of the inlet passage 2x. Then, the chemical solution passes through the passage 10 as shown by arrows a, b, c, d, e, f, g, h and i while contacting to the thermal conducting plate 3 (anti-corrosion plate 3P), whereby the temperature is controlled by the thermal conduction from the thermal conducting plate 3 that is heated/cooled by the Peltier module 4.

The chemical solution to be temperature controlled by passing through the passage 10 flows out from the fluid outlet 2o to the outlet passage 2y and the outlet passage 2z, and is discharged to the outside through the outlet pipe 2O as shown by an arrow o.

Here, the passage 10 in the fluid temperature control device 1 connects the fluid inlet 2i and the fluid outlet 2o in the main body block 2 as described above, while being formed in one single passage having the approximate constant passage cross-sectional area over its entire length. Thus, the flow velocity of the chemical solution is uniform over the entire area of the passage, whereby the variation in the thermal conduction between the chemical solution and the thermal conducting plate 3 can be prevented from occurring.

Accordingly, since there is no nonuniformity in the local temperature in the thermal conducting plate 3, the junction temperature can be prevented from partially rising. Therefore, the mechanical life of Peltier module above can be prevented from inadvertently decreasing.

Additionally, the passage 10 in the fluid temperature control device 1 has a spiral shape that winds in one direction, in other words, is formed so as to have a smooth curve while the passage cross-sectional area of the passage 10 is approximately constant over its entire length as described above, whereby the chemical solution passing through the passage 10 has less pressure loss and high flow velocity.

Accordingly, the thermal conduction between the thermal conducting plate 3 and the chemical solution is efficiently performed. Therefore, the capacity of controlling the temperature (capacity of heating/cooling) of the chemical solution can be significantly improved.

Additionally, in the fluid temperature control device 1 above, the drain passage 2d that communicates the adjacent passage channels 2g, 2g is formed in the walls 2w, 2w, . . . in the main body block 2. Thus, the chemical solution remaining in the passage 10 at the time when the device is stopped can be discharged to the outside of the device through the drain passage 2d above, whereby the inconvenience that the chemical solution remaining in the passage 10 scatters around can be prevented from occurring when the main body block 2 and the thermal conducting plate 3 are disassembled during maintenance and the like.

Figure 4:
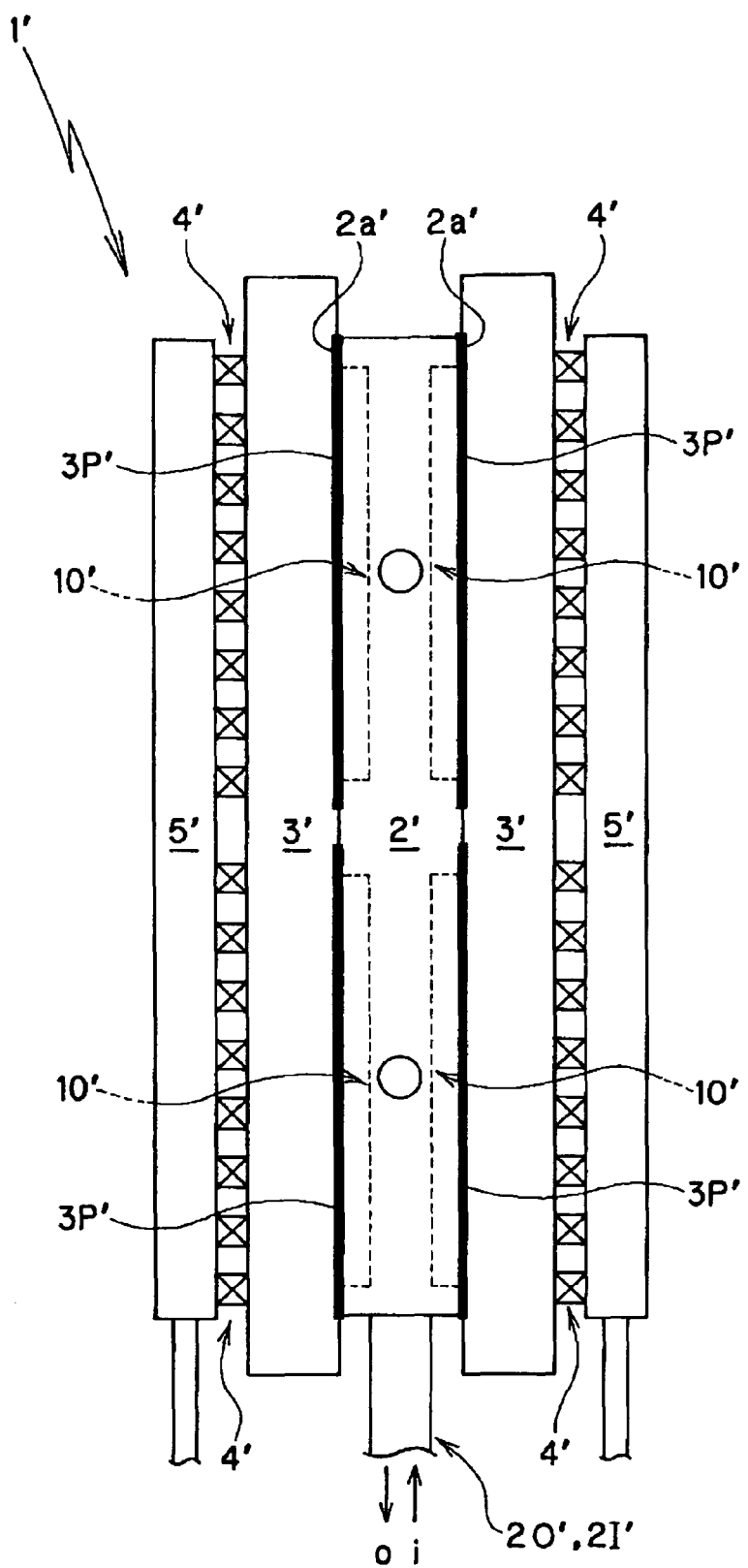
FIG. 4 is a conceptual overall plan view showing another example of the fluid temperature control device according to the present invention.
Figure 5:
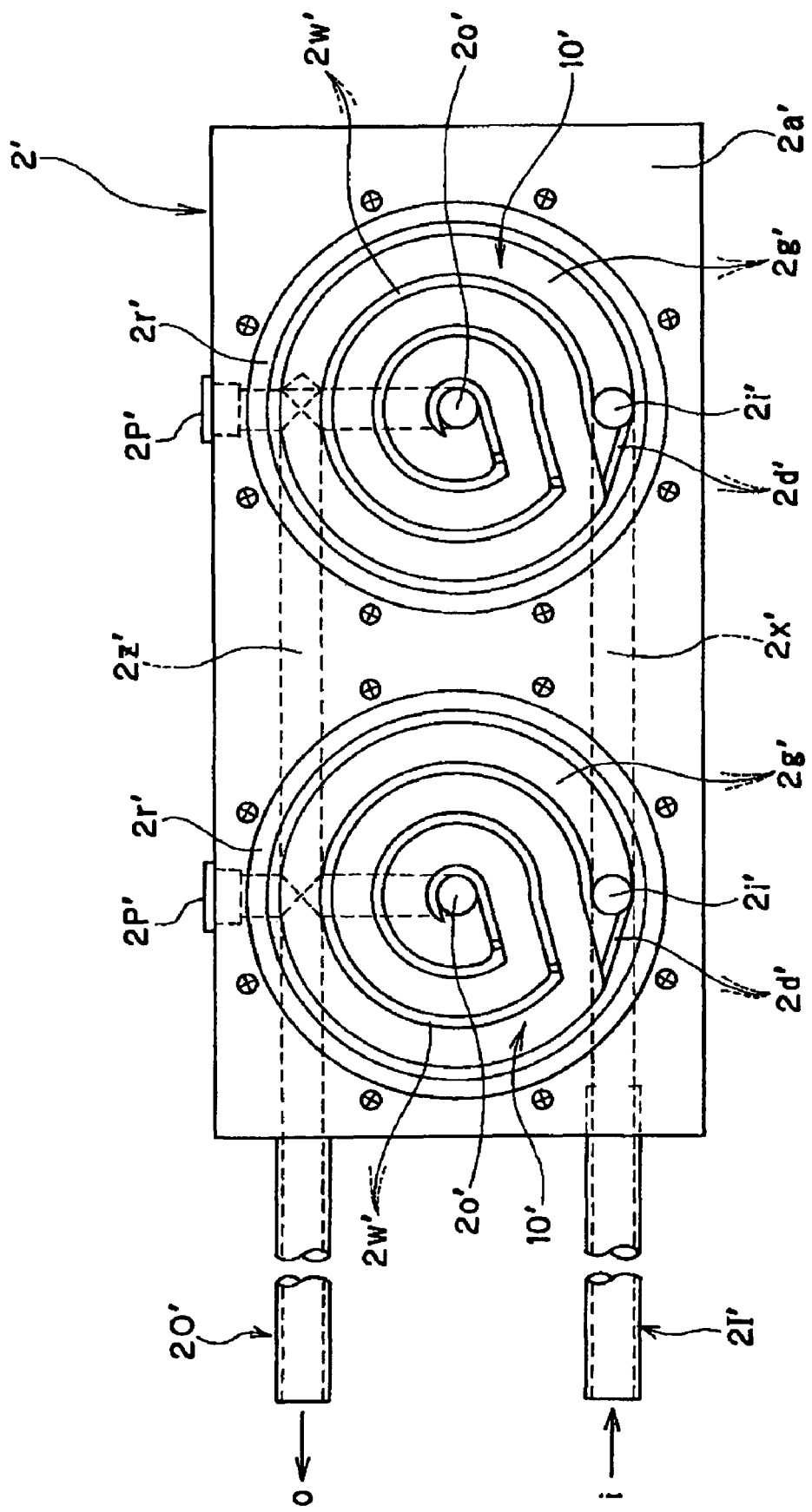
FIG. 5 is an overall side view of the main body block of the fluid temperature device shown in FIG. 4.

In a fluid temperature control device 1' shown in FIGS. 4 and 5, two passage channels 2g', 2g' are formed in a parallel position to each right surface and left surface 2a', 2a' of a main body block 2'. The passage channels 2g', 2g' are communicated each other through an inlet passage 2x' and an outlet passage 2z'.

Additionally, two anti-corrosion plates 3P', 3P' corresponding to the passage channels 2g', 2g' placed in parallel are fixed to each of thermal conducting plates 3', 3'. And, two Peltier modules 4', 4' corresponding to the passage channels 2g', 2g' placed in parallel are attached in a parallel position to outer surfaces of the thermal conducting plates 3', 3'.

The configuration of the fluid temperature control device 1' described above is basically the same as the fluid temperature control device 1 shown in FIGS. 1 through 3, except that two passage channels 2g', 2g' are placed in a parallel position to the surface 2a' of the main body block 2', and two anti-corrosion plates 3P' and two Peltier modules 4', 4' corresponding to the passage channels are placed in parallel. Thus, for each of the components in the fluid temperature control device 1' that has the same effect as the component in the fluid temperature control device 1, a reference numeral in which ' (dash) is added to the reference numeral of the corresponding component in FIGS. 1 through 3 is attached to the corresponding component in the fluid temperature control device 1', and the detailed description is omitted.

With the configuration of the fluid temperature control device 1', by forming a number of (four channels in the exemplary embodiment) passage channels 2g' on the surface 2a' of the main body block 2', the contacting area between the chemical solution passing through each of the passages 10', 10', ... and the thermal conducting plates 3', 3' becomes large, whereby the capacity of controlling the temperature (capacity of heating/cooling) of the chemical solution can be further improved.

Figure 6:
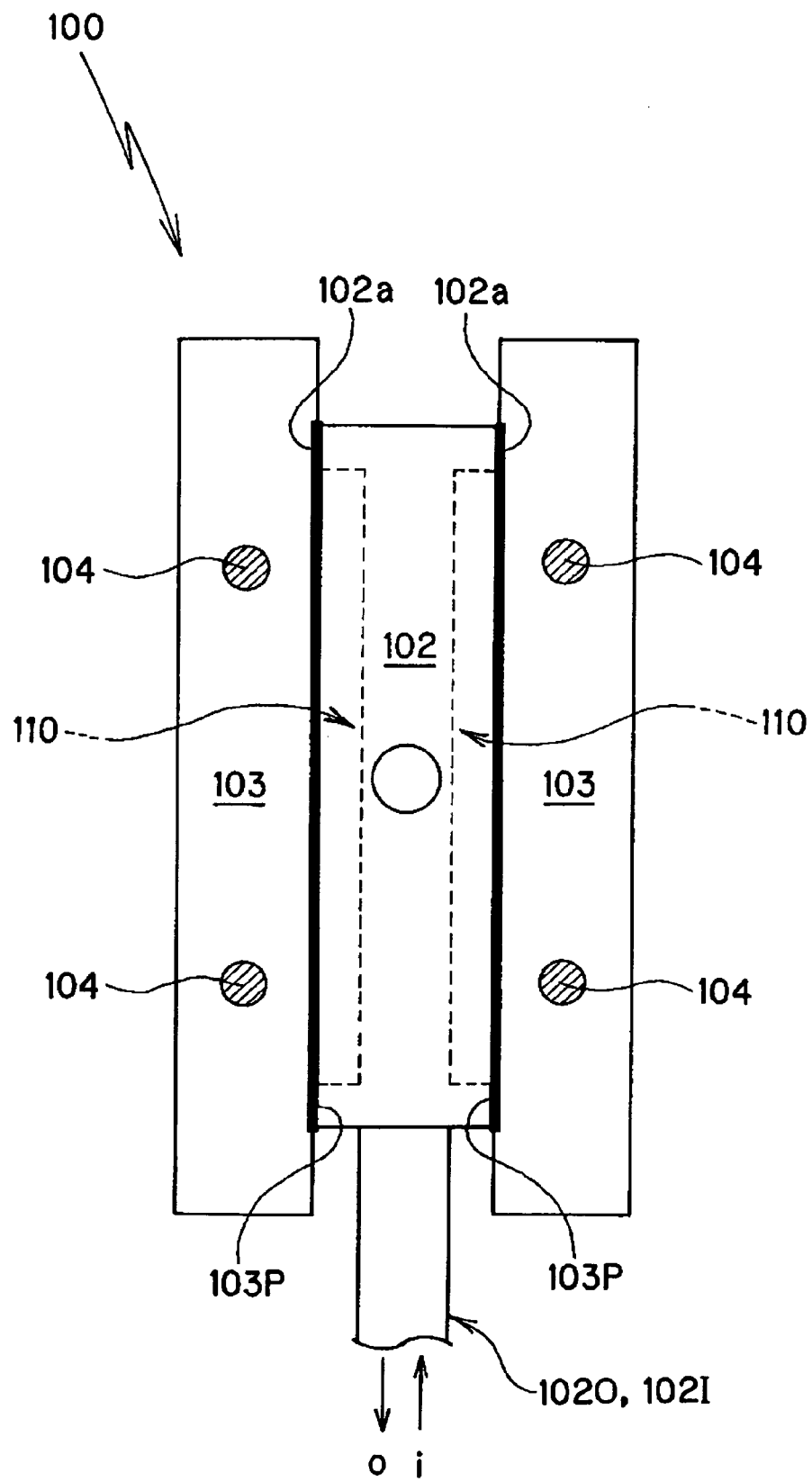
FIG. 6 is a conceptual overall plan view showing another example of the fluid temperature control device according to the present invention.

A fluid temperature control device 100 shown in FIG. 6 is one example case where temperature control of the chemical solution (fluid to be temperature controlled) is performed only for heating. In the fluid temperature control device 100, passages 110, 110 are formed between a main body block 102 and each of a right and a left thermal conducting plates 103, 103 placed so as to sandwich the main body block 102. Additionally, heaters 104, 104 are provided as temperature control means inside the right and left thermal conducting plates 103, 103, respectively.

The configuration of the fluid temperature control device 100 described above is basically the same as the fluid temperature control device 1 shown in FIGS. 1 through 3, except that the heater 104 is provided inside the main body block 103 in place of the Peltier module and a water cool plate. Thus, for each of the components in the fluid temperature control device 100 that has the same effect as the component in the fluid temperature control device 1, a reference numeral in which 100 is added to the reference numeral of the corresponding component in FIGS. 1 through 3 is attached to the corresponding component in the fluid temperature control device 100, and the detailed description is omitted.

With the configuration of the fluid temperature control device 100, as is the case with the fluid temperature control device 1 shown in FIGS. 1 through 3, the chemical solution is entered into an inlet pipe 102I as shown by an arrow i, and flows into a passage 110. The chemical solution passes through the passage 110 while contacting to the main body block 103 (anti-corrosion plate 103P), whereby the chemical solution is heated by the thermal conduction from the thermal conducting plate 103 heated by the heater 104. Then, the chemical solution is discharged from an outlet pipe 102O as shown by an arrow o.

Here, with the fluid temperature control device 100 described above, it is needless to say that the capacity of controlling the temperature (capacity of heating) of the chemical solution can be improved, as is the case with the fluid temperature control device 1 shown in FIGS. 1 through 3.

Incidentally, it is needless to say that the shape of the passage channel forming the passage of the fluid temperature control device is not limited to, for example, the passage channel (passage) having the spiral shape with an approximate circle in the fluid temperature control device 1 shown in FIGS. 1 through 3, and it may be possible to employ various shapes in accordance with the specifications of the fluid temperature control device.

Figure 7:
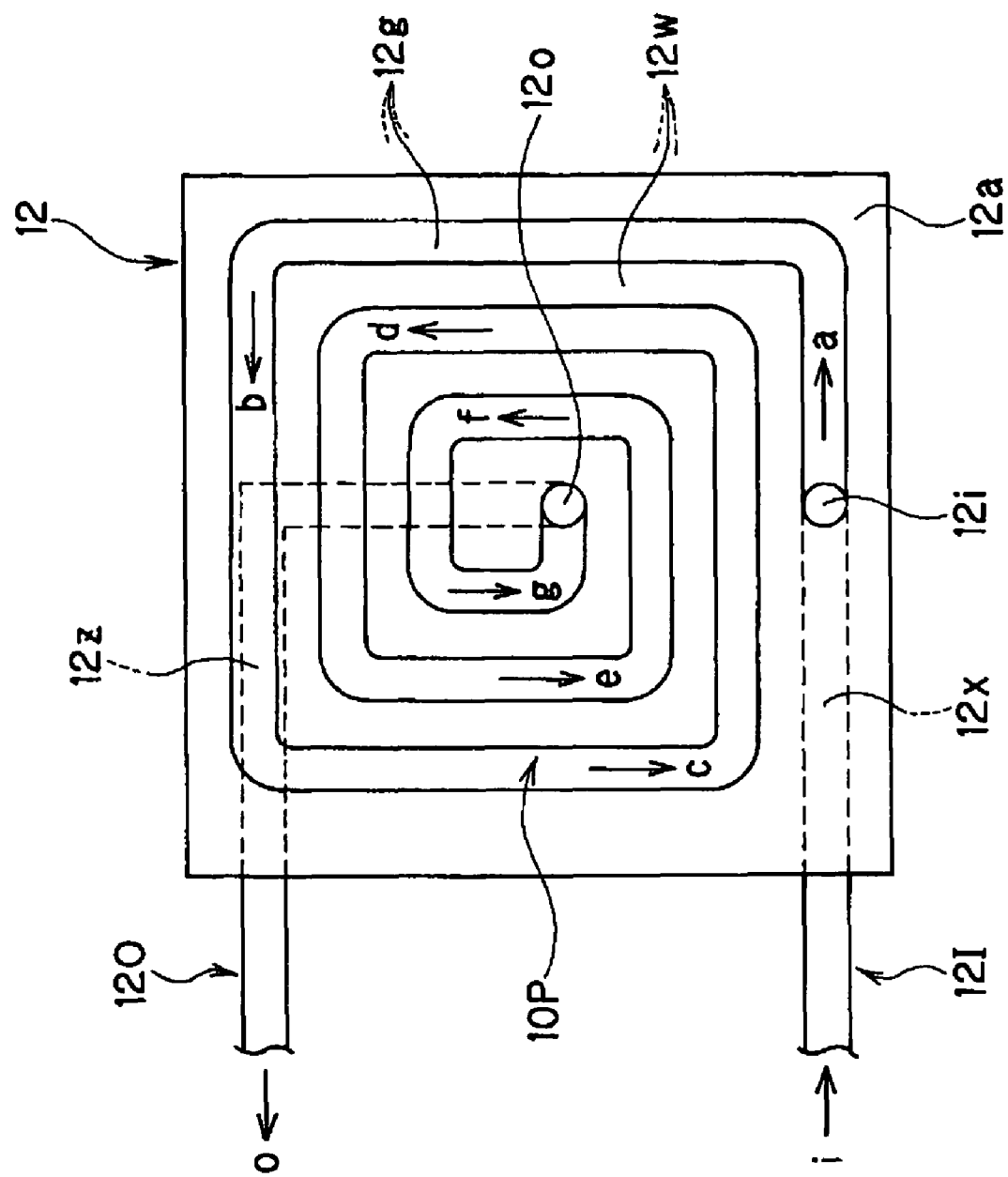
FIG. 7 is a conceptual view showing a modification of a passage channel in the main body block of the fluid temperature control device according to the present invention.

A passage channel 12g formed in a surface 12a of a main body block 12 shown in FIG. 7 has a spiral shape with an approximate rectangle that winds from a fluid inlet 12i toward a fluid outlet 12o in the center. The chemical solution is entered into an inlet pipe 12I as shown by an arrow i, and flows through an inlet passage 12x to a passage 10P. After passing through the passage 10P in a counter-clockwise direction as shown by arrows a, b, c, d, e, f and g, the chemical solution is discharged through an outlet passage 12z from an outlet pipe 12O as shown by an arrow o.

Figure 8:
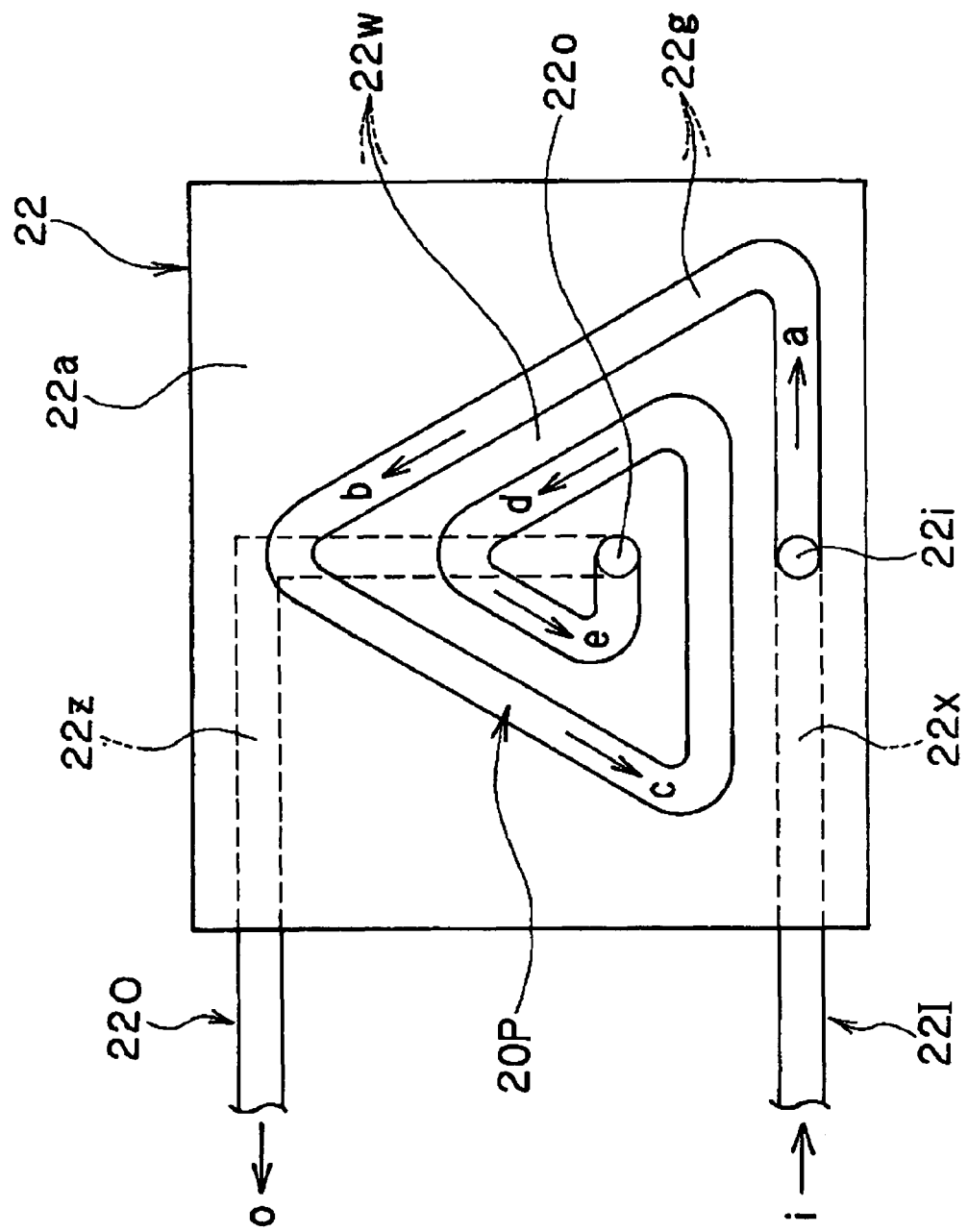
FIG. 8 is a conceptual view showing a modification of a passage channel in the main body block of the fluid temperature control device according to the present invention.

A passage channel 22g formed in a surface 22a of a main body block 22 shown in FIG. 8 has a spiral shape with an approximate triangle that winds from a fluid inlet 22i toward a fluid outlet 22o in the center. The chemical solution is entered into an inlet pipe 22I as shown by an arrow i, and flows through an inlet passage 22x to a passage 20P. After passing through the passage 20P in a counter-clockwise direction as shown by arrows a, b, c, d and e, the chemical solution is discharged through an outlet passage 22z from an outlet pipe 22O as shown by an arrow o.

Figure 9:
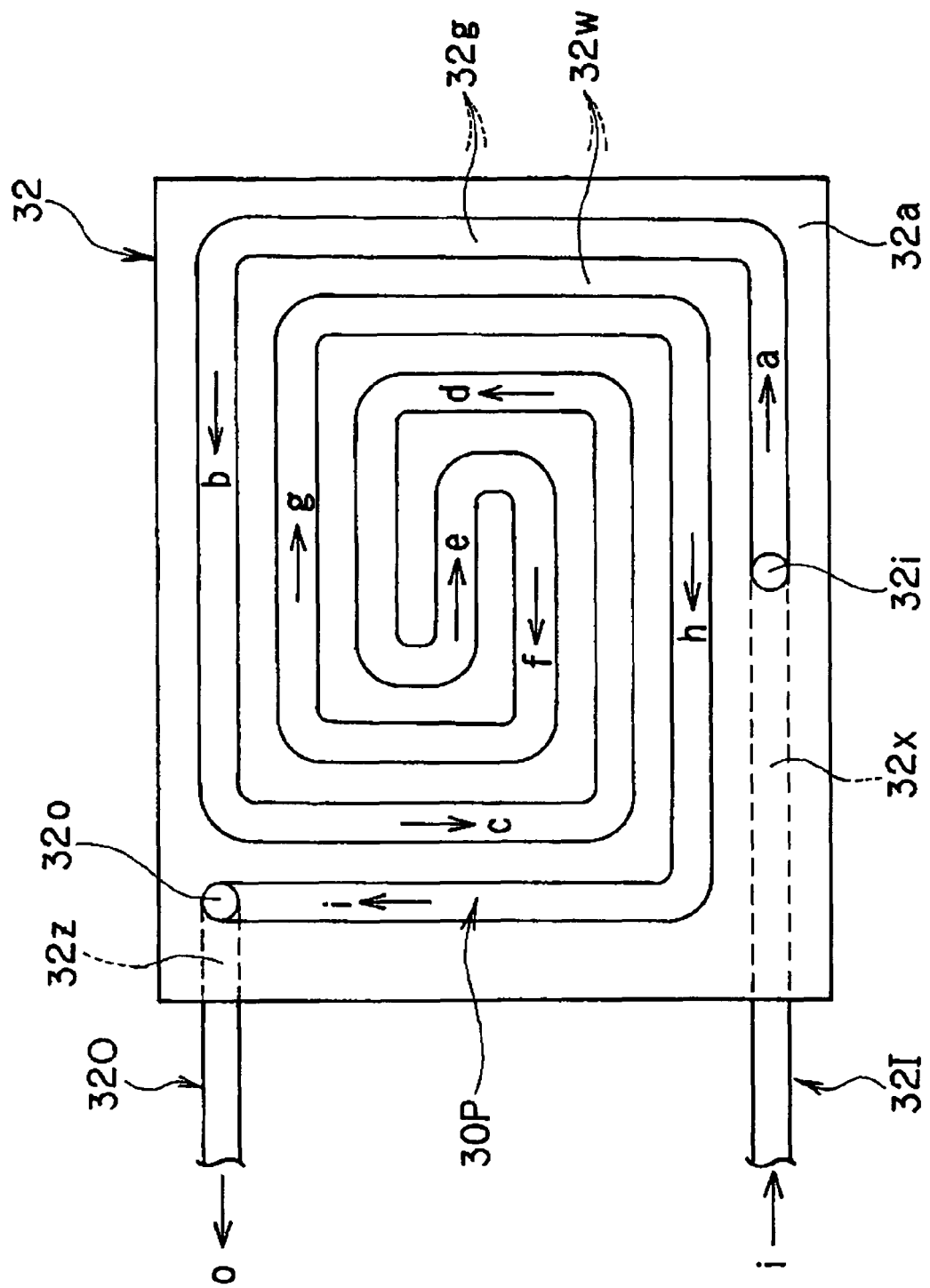
FIG. 9 is a conceptual view showing a modification of a passage channel in the main body block of the fluid temperature control device according to the present invention.

A passage channel 32g formed in a surface 32a of a main body block 32 shown in FIG. 9 has a shape that winds in a counter-clockwise direction from a fluid inlet 32i to the center, and then reverses its direction to wind in a clockwise direction from the center to a fluid outlet 32i. The chemical solution is entered into an inlet pipe 32I as shown by an arrow i, and flows through an inlet passage 32x to a passage 30P. After passing through the passage 30P as shown by arrows a, b, c, d, e, f, g, h and i, the chemical solution is discharged through an outlet passage 32z from an outlet pipe 32O as shown by an arrow o.

Figure 10:
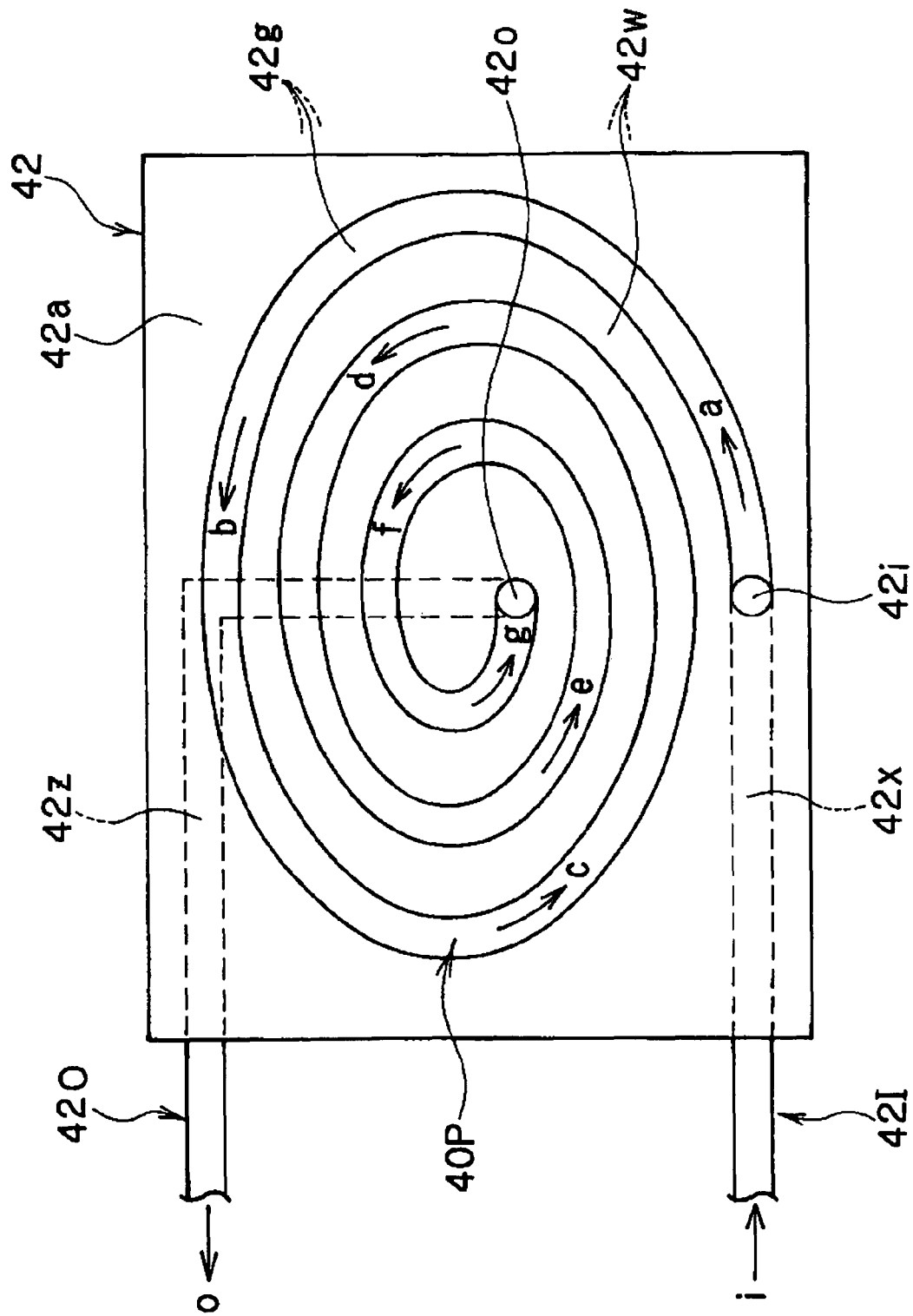
FIG. 10 is a conceptual view showing a modification of a passage channel in the main body block of the fluid temperature control device according to the present invention.
Figure 11:
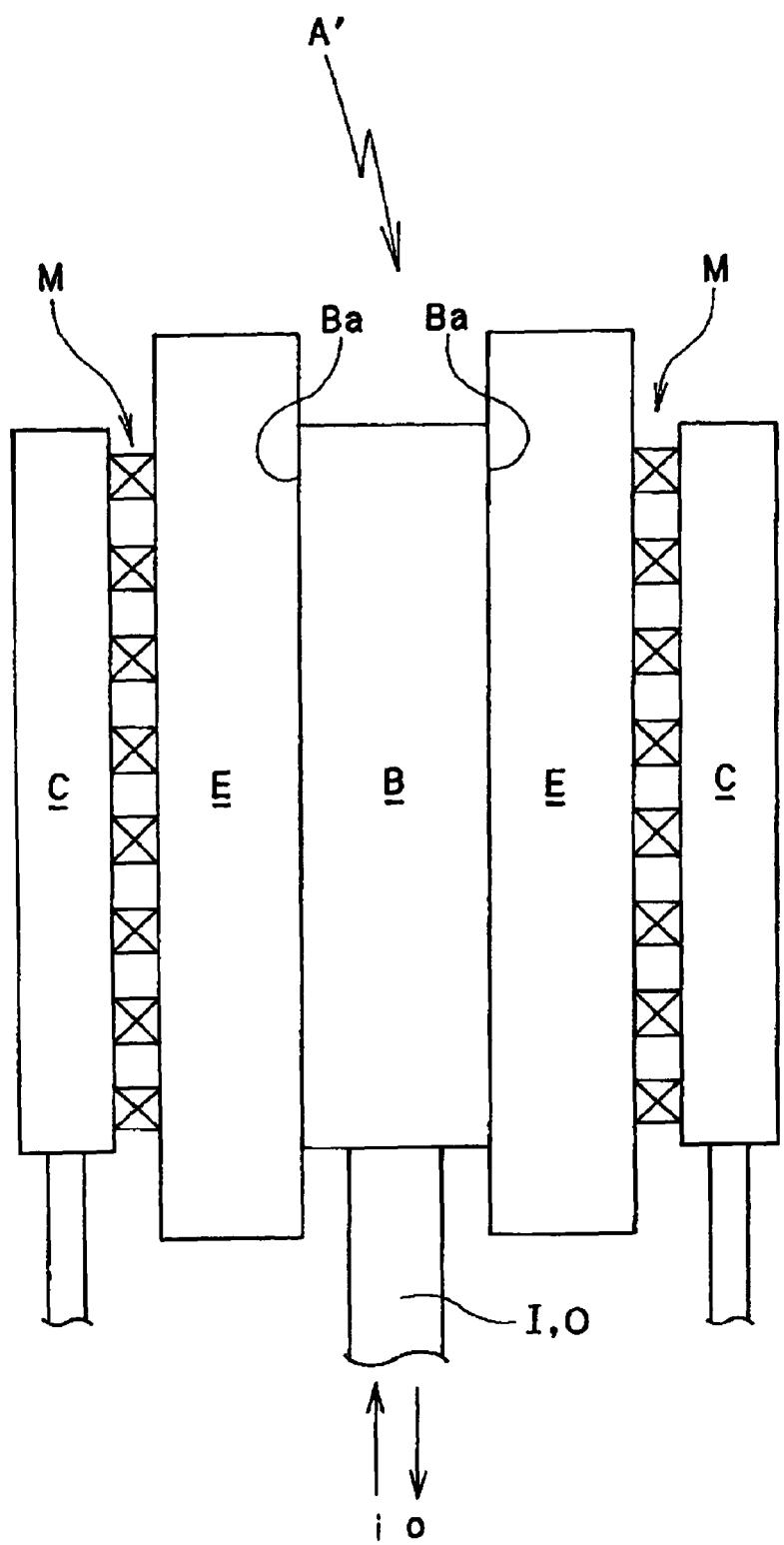
FIG. 11 is a conceptual overall plan view showing a conventional fluid temperature control device.
Figure 12:
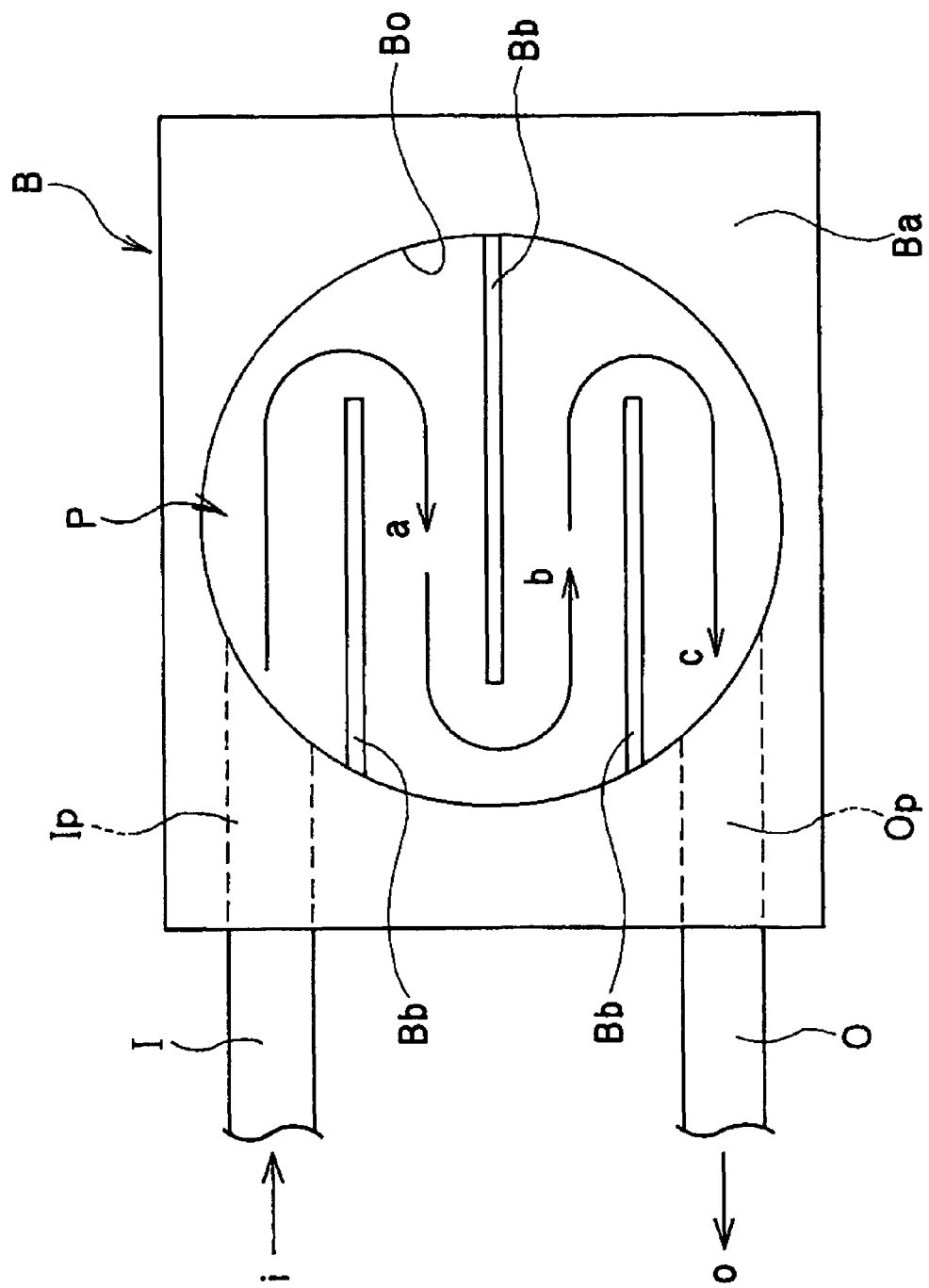
FIG. 12 is a conceptual side view showing a passage in the main body block of the conventional fluid temperature control device.
Figure 13:
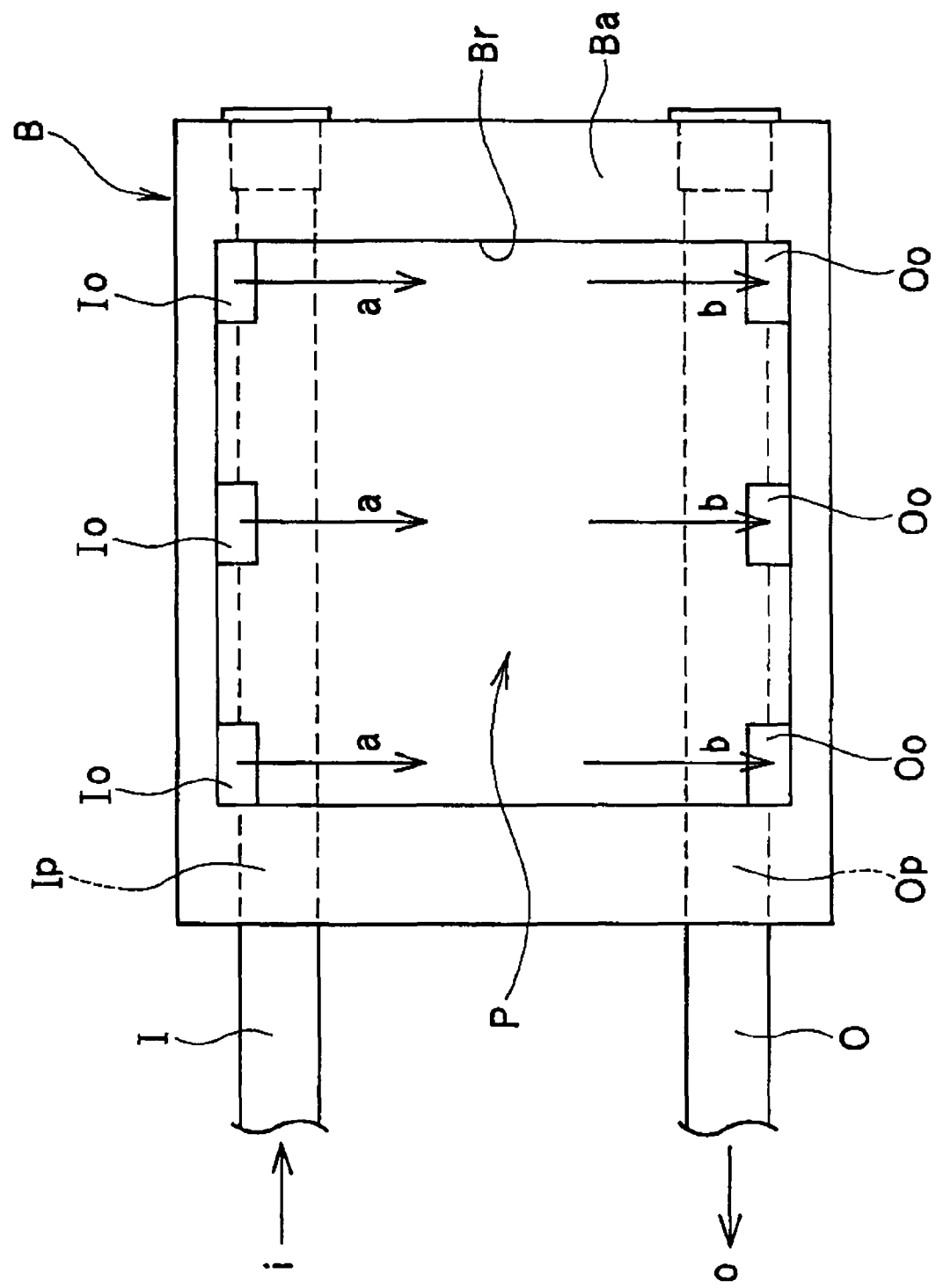
FIG. 13 is a conceptual side view showing a passage in the main body block of the conventional fluid temperature control device.

A passage channel 42g formed in a surface 42a of a main body block 42 as shown in FIG. 10 has a spiral shape with an approximate ellipse that winds from a fluid inlet 42i toward a fluid outlet 42o in the center. The chemical solution is entered into an inlet pipe 42I as shown by arrow i, and flows through an inlet passage 42x to a passage 40P. After passing through the passage 40P as shown by arrows a, b, c, d, e, f and g, the chemical solution is discharged through an outlet passage 42z from an outlet pipe 42O as shown by an arrow o.

Here, since each of the passages 10P, 20P, 30P and 40P shown in FIGS. 7 through 10 is formed so as to have an approximate constant passage cross-sectional area over its entire length, the chemical solution can pass through the passage with less pressure loss and with a high flow velocity, whereby the thermal conduction between the thermal conducting plate and the chemical solution can be efficiently performed. Accordingly, needless to say, the capacity of controlling the temperature (capacity of heating/cooling) of the chemical solution can be improved.

Additionally, a drain passage (not shown) that communicates adjacent passage channels is formed in each of walls 12w, 22w, 32w, 42w provided between the adjacent passage channels in each of the main body blocks 12, 22, 32 and 42 shown in FIGS. 7 through 10. Needless to say, this drain passage is effective for making the chemical solution remaining in each of the passages (10P, 20P, 30P 40P) discharged to the outside of the device through the drain passage at the time when the device is being stopped.

It should be noted that each of the exemplary embodiments has been described as an example case where the fluid temperature control device of the present invention is applied to the temperature control of the chemical solution used for the wet process (RCA cleaning process), a wet etching or other process in connection with manufacturing using semiconductor devices. However, it may be possible to effectively employ the fluid temperature control device of the present invention to control temperature of chemical solutions in various manufacturing processes.

Additionally, each of the exemplary embodiments has been described as an example case where the present invention is applied to the manufacturing field in the semiconductor devices. However, it may be possible to effectively apply the fluid temperature control device of the present invention to various facilities in various industrial fields that require precise temperature control.

What is claimed is:

1. A fluid control device, comprising:
a main body block having a passage channel formed in a surface thereof, the main body block being of a corrosion resistant resin material,
a thermal conducting plate that is provided on the surface of the main body block, and covers the passage channel to form a passage for passing a corrosive fluid to be temperature controlled, the thermal conducting plate being made of metal with a high thermal conductivity; and
temperature control means that carries out heat exchanging, by way of the thermal conducting plate, with the corrosive fluid passing through the passage,
wherein
an anti-corrosion plate is fixedly provided on a surface of the thermal conducting plate facing the main body block, the anti-corrosion plate being resistant to the corrosive fluid and having a high thermal conductivity,
the thermal conducting plate being connected to the surface of the main body block via the anti-corrosion plate, and
the passage abutting on the thermal conducting plate connects a fluid inlet and a fluid outlet formed in the main body block, and is a single passage having an approximately constant passage cross-sectional area over its entire length and having a spiral shape.

2. The fluid control device according to claim 1, wherein
A drain passage that communicates adjacent passages is formed in a wall provided between adjacent passage channels in the main body block.

\* \* \* \* \*